US 6,514,863 B1

(12) United States Patent
He

(10) Patent No.: US 6,514,863 B1
(45) Date of Patent: Feb. 4, 2003

(54) METHOD AND APPARATUS FOR SLURRY DISTRIBUTION PROFILE CONTROL IN CHEMICAL-MECHANICAL PLANARIZATION

(75) Inventor: Gang He, Colorado Springs, CO (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 09/513,709

(22) Filed: Feb. 25, 2000

(51) Int. Cl.$^7$ .............................................. H01L 21/302
(52) U.S. Cl. ........................ 438/692; 438/693; 216/88; 216/89; 451/57; 451/60
(58) Field of Search ................................ 438/692, 693; 216/88, 89; 451/57, 60

(56) References Cited

U.S. PATENT DOCUMENTS

| | | | |
|---|---|---|---|
| 5,139,608 A | | 8/1992 | Grivna ........................ 156/643 |
| 5,246,525 A | * | 9/1993 | Sato ............................ 156/345 |
| 5,395,801 A | | 3/1995 | Doan et al. ................. 437/225 |
| 5,478,435 A | * | 12/1995 | Murphy et al. ........... 156/636.1 |
| 5,516,346 A | | 5/1996 | Cadien et al. ................ 51/308 |
| 5,643,406 A | | 7/1997 | Shimomura et al. ..... 156/636.1 |
| 5,665,202 A | | 9/1997 | Subramanian et al. ...... 438/692 |
| 5,876,271 A | * | 3/1999 | Oliver .......................... 451/60 |
| 5,934,979 A | | 8/1999 | Talieh ........................... 451/41 |
| 5,934,980 A | * | 8/1999 | Koos et al. .................... 451/41 |
| 5,941,761 A | | 8/1999 | Nagahara ...................... 451/56 |
| 6,017,463 A | * | 1/2000 | Woo et al. ................. 252/79.1 |
| 6,235,635 B1 | * | 5/2001 | Roy ........................... 438/691 |

* cited by examiner

Primary Examiner—George Goudreau
(74) Attorney, Agent, or Firm—Christie, Parker & Hale, LLP

(57) ABSTRACT

A nonplanar substrate surface is substantially uniformly planarized by a chemical mechanical planarization (CMP) process. The CMP process uses multiple sources of slurry delivered in between a slurry distribution screen and a slurry membrane of the CMP apparatus. The multiple slurry sources have differing chemical and physical compositions, and are delivered to different locations along the membrane. The slurries bleed into each other during polish to form a radially-variable, slurry abrasiveness concentration gradient. As a result, there are areas with a greater abrasiveness concentration of slurry, and hence a greater frictional contact. The slurry flow rate and concentration is adjusted along the wafer surface according to the non-uniformly planar areas of the wafer. Consequently, uniform planarization is substantially achieved.

35 Claims, 2 Drawing Sheets

METHOD AND APPARATUS FOR SLURRY DISTRIBUTION PROFILE CONTROL IN CHEMICAL-MECHANICAL PLANARIZATION

BACKGROUND OF THE INVENTION

The present invention generally relates to polishing of semiconductor wafers, and more particularly to chemical-mechanical planarization of semiconductor wafers with integrated circuits.

Semiconductor circuits are often fabricated by deposition of multiple layers of materials on a wafer of a high-purity semiconductor. Generally, the wafer and each layer should be a substantially uniformly planar surface. If the wafer, including the substrate and/or layers on the substrate, do not have substantially uniformly planar surfaces, difficulties may arise during fabrication of the semiconductor surface. For example, a conductive layer deposited over a nonplanar insulating layer may cause difficulties in conductive layer patterning and etching which may give rise to short circuits. In such a case, the conductive layer is not insulated electrically. More particularly, imaging fine-line patterns over the semiconductor wafer, as well as forming various components and interconnects, is often more difficult when a wafer surface is nonplanar.

Chemical-mechanical planarization (CMP) is sometimes performed to flatten the wafer and the successive layers. CMP involves application of a polishing pad, along with a slurry, to the surface of the wafer or the successive layers. Mechanical polishing occurs when the polishing pad is applied to the surface of the wafer or the successive layers. The slurry, often a chemically active abrasive, is used in conjunction with the polishing pad to remove wafer or deposited material.

A uniformly planar surface, however, is sometimes difficult to achieve using CMP. Nonuniformities in the removal rate of material, and thus in a resulting wafer surface, may occur for a variety of reasons. For example, flaws in the polishing pad may result in local nonuniformities in a wafer surface. In addition, there may be increased frictional contact between the polishing pad and the wafer at some areas due to the mounting of the polishing pad and wafer, or due to relative velocities of the polishing pad and wafer. The increased frictional contact may also result in a non-uniform surface. For many nonuniformities, however, the underlying cause may not be fully understood.

SUMMARY OF THE INVENTION

A nonplanar wafer surface is substantially uniformly planarized by a chemical mechanical planarization (CMP) process. The CMP process uses multiple sources of slurry delivered between a polishing pad and a substrate or wafer to achieve a planar wafer surface. The multiple slurry sources have differing compositions.

The slurry sources are delivered to different locations in between the substrate and the polishing pad. The delivery compositions of the different slurries of different locations depend upon the location of non-uniformities on the wafer. In an embodiment, the slurries bleed into each other during polish to form a radially-variable, slurry composition concentration gradient.

The polish removal rate due to the slurry composition is adjustable according to the location of the non-uniformities in the wafer surface, until substantially uniform planarization results.

DESCRIPTION OF THE DRAWINGS

These and other features of the present invention will be better understood from the following detailed description and accompanying drawings, wherein.

DETAILED DESCRIPTION

Figure 1:
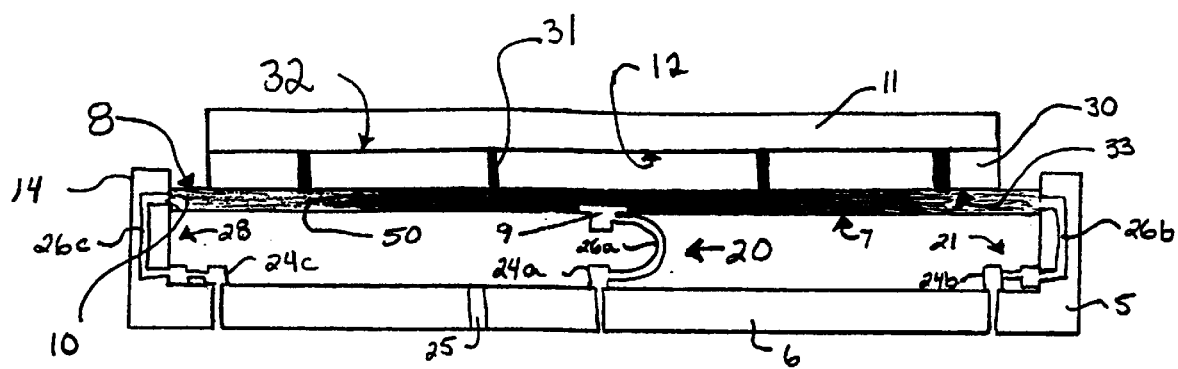
FIG. 1 is a schematic cross-sectional view of a chemical mechanical planarization (CMP) apparatus for a radially-variable, slurry abrasiveness concentration gradient.

FIG. 1 illustrates a cross sectional view of a chemical mechanical planarization (CMP) apparatus 5 in accordance with the present invention. The CMP apparatus includes a base 6 and walls 14 substantially perpendicular to the base. A flexible membrane 7 is spaced above and substantially parallel to the plane of the base. The flexible membrane has edges connected to the walls of the CMP apparatus. The base includes a pressure source 25. The pressure source supplies air pressure to push against and support the flexible membrane. The air is blown into the volume defined by the base of the CMP apparatus, the walls of the CMP apparatus, and the flexible membrane. A slurry distribution screen 8 is spaced above and substantially parallel to the plane of the flexible membrane. The slurry distribution screen is a flexible wire grid with apertures large enough for slurry to pass through. Thus, the flexible membrane, the slurry distribution screen, and the walls define a slurry receiving volume.

As illustrated, a polishing pad 30 is disposed upon the slurry distribution screen. A semiconductor wafer or substrate 11 is disposed upon the polishing pad. The polishing pad is moved in a small orbital path so that the polishing pad rubs against the wafer. To further ensure that irregularities in the polishing pad or the alignment of the polishing pad and the wafer do not result in local non-uniformities in the wafer, the wafer is also rotated about its axis. Thus, frictional contact between the polishing pad and the wafer is caused by relative motion of the polishing pad and the wafer.

CMP apparatus may differ in some aspects from the foregoing, however. For example, in one embodiment, the polishing pad rotates in a rotary path and the wafer rotates at a speed similar to the polishing pad. In an alternative embodiment, the flexible membrane is replaced by a rigid surface.

The polishing pad includes numerous holes 31 extending from an upper, or first, surface 32 to a lower, or second, surface 33 of the polishing pad. The holes allow slurry to flow between the polishing pad and the wafer surface at numerous locations. In the embodiment described, the polishing pad has on the order of 60 to 100 holes. The slurry chemically reacts and mechanically interacts with the wafer surface. The chemical reaction is due to the composition of the slurry. The mechanical interaction is due to an abrasive in the slurry. The abrasive is comprised of particles or grit which, in combination with the polishing pad, physically removes material from the wafer surface.

In the CMP apparatus of FIG. 1, slurry is delivered to slurry receiving volume between the flexible membrane and the slurry distribution screen. Multiple slurry sources and delivery systems are used. Thus, the CMP apparatus of FIG. 1 includes first and second delivery systems 20, 21. The first and second slurry delivery systems include pumps 24a, 24b, tubes 26a, 26b and slurry reservoirs (not shown) acting as slurry sources, respectively. The pumps, which may be for example peristaltic pumps, pump slurry from the slurry sources through the tubes to the volume between the flexible membrane and the slurry distribution screen. The slurry then flows up through the slurry distribution screen through the holes in the polishing pad to between the polishing pad and the wafer surface.

The first slurry delivery system in the CMP apparatus of FIG. 1 is a center slurry delivery system 20. Accordingly, the first slurry delivery system provides slurry from a first slurry reservoir to about a center portion of the polishing pad through a hole 9 in the center of the slurry membrane. The tube 26a connects to the hole 9. In a CMP apparatus using a non-rigid membrane, the tube is flexible to allow for membrane movement. The slurry from the first slurry source thereafter passes through the holes in the polishing pad, particularly through holes in a central region of the polishing pad, to the wafer surface.

The second slurry delivery system is an edge slurry delivery system. The edge slurry delivery system provides slurry from the second slurry source to edge portions of the polishing pad through openings 10 in the walls of the CMP apparatus. The openings are substantially equally spaced along the walls of the CMP apparatus so as to provide substantially similar slurry flow rates to a number of points around the periphery of the wafer and polishing pad between the slurry distribution screen and the slurry membrane. In the described embodiment, there are 16 openings and 16 corresponding edge slurry sources that deliver the same slurry composition. The slurry from the edge source pass through the holes in the polishing pad, particularly through holes near the edges of the polishing pad, to the wafer surface.

In the described embodiment, the center slurry source has a slurry with a different chemical and physical composition than the edge slurry source. For purposes of description, the first slurry will be primarily described as having increased abrasiveness as compared to the second slurry. It should be recognized, however, that in an alternative embodiment, the chemical concentrations of components of the slurries differ. Indeed, in one embodiment one of the slurries contains no abrasives or active chemicals.

The slurry from the center and edge slurry sources bleed, or mix, into each other to form a radially-variable slurry abrasiveness concentration gradient 50, as indicated in FIG. 1. In the described embodiment, the slurry bleeding results in a slurry abrasiveness concentration that decreases radially along the polishing pad. In one embodiment, prior to passing through the holes in the polishing pad, slurries from the various slurry sources bleed together in the volume between the screen and the membrane. Accordingly, slurry passing through a specific hole in the polishing pad is potentially mixed slurry from several slurry sources, with the sources having varying weights depending on the locations and flow rates of the slurry sources. Alternatively or additionally, the slurries from the differing slurry sources bleed or mix into each other in between the polishing pad and the wafer, and thus, the variable concentration gradient occurs between the polishing pad and the wafer.

As a result of delivery of slurry with increased abrasiveness to the center portion of the wafer, the removal rate of the material from areas near the center of the wafer is increased. Thus, in the event that wafer thickness is too great approximate the center of the wafer using a single slurry, the embodiment of FIG. 1 may be used to increase wafer removal in that area.

Additionally or alternatively, the amount of flow from the slurry sources may be adjusted, as discussed below, depending upon the location of the non-uniformities along the wafer surface. The adjustment of the slurry sources changes the amount of slurry concentration across the wafer surface and, thereby, changes the frictional contact between the polishing pad and the wafer according to the location of the non-uniformity.

In one alternative embodiment, the slurry sources each have separate slurry flow rate controls. The use of different pumps allows for different slurry flow rates. The slurry flow rate is controlled by the pumps of the slurry delivery systems. Adjustability of the relative flow rates of the slurry delivery systems allows for increased control of the abrasiveness concentration gradient. Depending upon the location of non-uniformity on the wafer surface, the flow rates are controlled by adjusting the relative pumps. Further, in one embodiment a processor (not shown) commands adjustment to the slurry delivery system flow rates. The processor issues commands based upon data provided in process recipes.

In an alternative embodiment, the first slurry source and the second slurry source each have separate slurry flow rate controls. The pump 24a of the first slurry source controls and adjusts the flow rate of the first slurry. The pump 24b of the second slurry source controls and adjusts the flow rate of the second slurry. The pump 24c of the third slurry source controls and adjusts the flow rate of the third slurry. Flow rates for the slurry sources are relatively similar. At similar flow rates, the abrasiveness concentration gradient is substantially evenly spread. In another embodiment, the center slurry source 20 is at a much higher flow rate than the edge slurry source 21. As a result, the difference in slurry abrasiveness concentration across the polishing pad is relatively small. Accordingly, the slurry between the polishing pad and the wafer is mostly from the center slurry source.

In order to decrease the difference in slurry abrasiveness concentration, the pumps are adjusted. From the embodiment described above with the higher flow rate of slurry from the center slurry source, there are several ways of providing more even slurry disbursement along the substrate surface. In particular, the pumps either decrease the flow rate from the pump 24a, or increase the flow rate from the pump 24b. The removal rate profile accordingly adjusts. If the non-uniformity is overcorrected, then the pumps either decrease the flow rate from the pump 24b, or increase the flow rate from the pump 24a. The removal rate profile is continually fine tuned in this manner. The monitoring of the removal rate profile by the device is programmable in process recipes.

Slurry solution is continually applied to the polishing pad during the CMP process. Continually applying the slurry during polishing allows the chemical planarization to continue. The slurry flow rates are maintained or monitored as discussed above.

As discussed above, the concentration gradient is formed by increasing the flow rate from the center slurry source which has a slightly higher slurry abrasiveness concentration. Use of this plural slurry delivery system allows for decreased use of chemically active or abrasive slurries. For example, some applications may result in excessive removal rates approximate a wafer's edge. In such applications the edge removal rate may be decreased by using water as the edge slurry. Alternatively, a similar concentration gradient is formed by having an even flow rate from the slurry sources, but with a larger difference between the abrasiveness concentration.

In an alternative embodiment, additional slurry delivery systems are used to provide additional control of slurry composition under the wafer. For example, in one embodiment multiple slurry delivery systems each provide slurry from different slurry sources to different points in the slurry receiving volume. Thus, individualized control of the slurry compositions and the slurry flow rates allow for a response to localized non-uniformities in the wafer surface.

Figure 2:
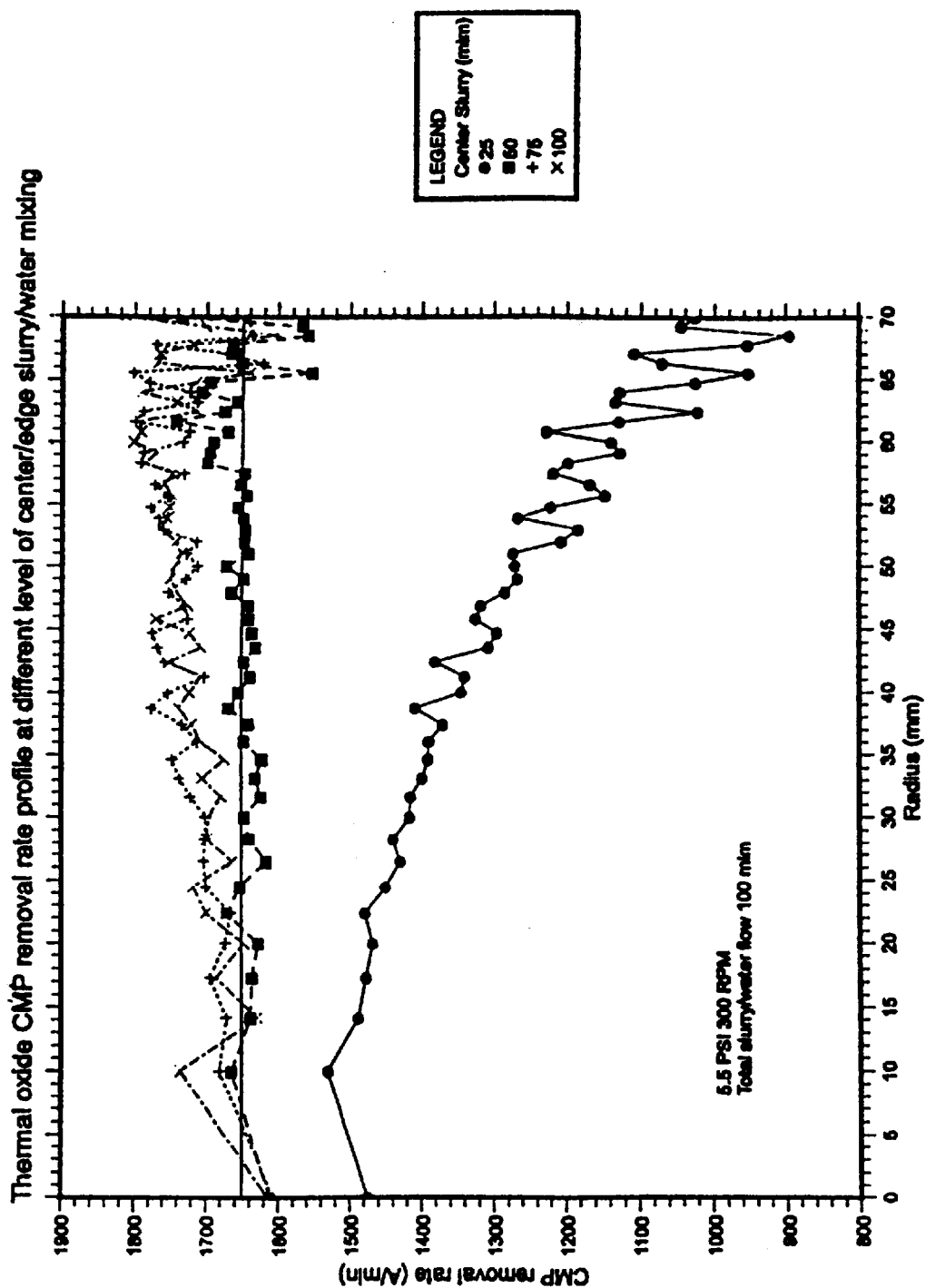
FIG. 2 is a chart of the CMP removal rate throughout the radius of the substrate for several slurry abrasiveness concentration gradients.

The chart of FIG. 2 illustrates one embodiment of a thermal oxide CMP removal rate profile at different levels of slurry flow using an IPEC 776 CMP system. At a pressure source of 5.5 psi, and a polishing pad rotational speed of 300 rpm, slurry is applied to the wafer surface. An independently controlled slurry pump delivers water as one of the slurries underneath the polishing pad edge during polishing pad rotation. At the same time, standard abrasive polish slurry is delivered to underneath the polishing pad at the center, as in a standard IPEC 776 configuration.

From the chart of FIG. 2, the total slurry/water flow from the center and the edge slurry flow sources is 100 mlm (milliliters per minute). Comparisons in the chart are made for slurry flow rates of 25, 50, 75, and 100 mlm from the central slurry source. Accordingly, the corresponding edge slurry flow rates are 75, 50, 25, and 0. As shown in the chart, when at least half of the slurry is from the center source, a substantially uniform cross-wafer removal rate profile, as well as edge-fast and edge-slow removal rate profiles, are obtained.

It should readily be understood that the embodiments described and illustrated herein are illustrative only, and are not to be considered as limitations upon the scope of the present invention. Other variations and modifications may be made in accordance with the spirit and scope of the present invention. For example, although the CMP polishing procedures of the exemplary embodiments described above were described for planarizing a dielectric insulating layer, such as silicon oxides, or a fill material overlying active circuit devices, it is understood that the scope of the present invention could similarly encompass planarization of a conductive layer or one particular dielectric material relative to a second type of dielectric material. Additionally, the method of the present invention could encompass substrates other than the silicon or gallium arsenide wafers used in the manufacture of integrated circuits. The polishing pad and the wafer are also not limited to the same round shape as shown in the Figures. The polishing pad and the wafer may have different shapes and/or sizes.

What is claimed is:

1. A method for chemical mechanical planarization of a substrate surface comprising:
    applying a polishing pad to the substrate surface, the polishing pad having a first side, a second side opposite the first side and facing the substrate surface, and holes extending from the first side of the polishing pad to the second side of the polishing pad;
    delivering a first slurry to the substrate surface; and
    delivering a second slurry to the substrate surface, the second slurry differing from the first slurry, whereby at least a portion of the second slurry is provided on the substrate surface at substantially the same time as the first slurry.

2. The method of claim 1 wherein the first slurry is delivered by a center slurry delivery system and the second slurry is delivered by an edge slurry delivery system.

3. The method of claim 1 wherein the first slurry is delivered to the substrate surface by providing slurry to a first area of the first side of the polishing pad.

4. The method of claim 3 further comprising delivering the second slurry to the substrate surface by providing slurry to a second area of the first side of the polishing pad.

5. The method of claim 4 wherein the holes of the polishing pad include first holes and second holes, the first holes being near a center portion of the polishing pad and the second holes being near an edge portion of the polishing pad.

6. The method of claim 5 wherein the second slurry is primarily delivered to the substrate surface through the second holes.

7. The method of claim 6 wherein the second slurry is less abrasive than the first slurry.

8. The method of claim 7 wherein the polishing pad moves in an orbital path relative to the substrate.

9. The method of claim 7 wherein the polishing pad moves in a rotary path relative to the substrate.

10. The method of claim 7 wherein the polishing pad has about 60 holes.

11. The method of claim 7 wherein the substrate is a semiconductor wafer.

12. The method of claim 1 further comprising adjusting flow rates of first and second slurry sources, respectively.

13. The method of claim 12 further comprising providing a first slurry source flow rate that is greater than a second slurry source flow rate.

14. The method of claim 12 further comprising providing a first slurry source flow rate that is substantially the same than a second slurry source flow rate.

15. The method of claim 4 wherein the first slurry has abrasives, wherein the second slurry has less abrasives than the first slurry, the method further comprising:
    rotating the polishing pad with respect to the substrate;
    providing a slurry distribution screen of a CMP apparatus upon which sits the polishing pad, and a slurry membrane of the CMP apparatus holding the first and second slurries before the first and second slurries are delivered to the substrate surface;
    distributing a slurry abrasiveness concentration between the slurry distribution screen and the slurry membrane that is greater at the center than at edge portions; and
    frictionally contacting the polishing pad to the substrate.

16. The method of claim 15 further comprising generating increased frictional contact at a predetermined area of the substrate by altering the composition of at least one of the first slurry and the second slurry.

17. A method to control a cross-wafer removal profile comprising:
    controlling a cross-polish-pad slurry distribution profile for a chemical mechanical planarization apparatus that uses a through-the-pad slurry delivery mechanism;
    delivering multiple sources of slurry having differring compositions to in between a wafer and a polishing pad, wherein when the multiple sources are delivered the slurries bleed into each other to form a radially-variable slurry composition concentration, wherein there is a slurry concentration in a polishing pad center that is different than a slurry composition concentration in a polishing pad edge section;
    rotating the polishing pad and the wafer relative to each other; and
    planarizing a wafer surface that faces a surface of the polishing pad.

18. The method of claim 17 wherein the wafer is a semiconductor wafer.

19. The method of claim 18 further comprising adjusting flow rates of first and second slurry sources of the multiple slurry sources.

20. The method of claim 19 wherein the delivering step includes delivering the multiples sources of slurry through a set of holes in a polishing pad.

21. The method of claim 20 wherein the CMP apparatus includes a slurry membrane impervious to air or slurry, and a slurry distribution screen upon which is the polishing pad, wherein before delivering to in between the wafer and a polishing pad, the delivery step includes delivering one of the multiple slurry sources to in between the slurry distribution screen of the CMP apparatus and the slurry membrane of the CMP apparatus.

22. The method of claim 21 wherein each slurry source has a pump and a slurry reservoir.

23. The method of claim 22 wherein each slurry source has different slurry reservoirs.

24. A method for chemical mechanical planarization of a substrate surface comprising:

applying a polishing pad to the substrate surface, the polishing pad having a first side, a second side opposite the first side and facing the substrate surface, and holes extending from the first side of the polishing pad to the second side of the polishing pad;

delivering a first slurry to the substrate surface; and delivering a second slurry to the substrate surface, wherein the first slurry and the second slurry are comprised of different compositions, wherein the first slurry is delivered to the substrate surface by providing slurry to a first area of the first side of the polishing pad, and wherein the second slurry is delivered to the substrate surface by providing slurry to a second area of the first side of the polishing pad.

25. The method of claim 24 wherein the holes of the polishing pad include first holes and second holes, the first holes being near a center portion of the polishing pad and the second holes being near an edge portion of the polishing pad.

26. The method of claim 25 wherein the second slurry is primarily delivered to the substrate surface through the second holes.

27. The method of claim 26 wherein the second slurry is less abrasive than the first slurry.

28. The method of claim 27 wherein the polishing pad moves in an orbital path relative to the substrate.

29. The method of claim 28 wherein the polishing pad moves in a rotary path relative to the substrate.

30. The method of claim 29 wherein the polishing pad has about 60 holes.

31. The method of claim 30 further comprising adjusting flow rates of first and second slurry sources, respectively.

32. The method of claim 31 further comprising adjusting first slurry source flow rate that is greater than a second slurry source flow rate.

33. The method of claim 32 further comprising providing a first slurry source flow rate that is substantially the same than a second slurry source flow rate.

34. The method of claim 33 wherein the first slurry has abrasives, wherein the second slurry has less abrasives than the first slurry, the method further comprising:

rotating the polishing pad with respect to the substrate;

providing a slurry distribution screen of a CMP apparatus upon which sits the polishing pad, and a slurry membrane of the CMP apparatus holding the first and second slurries before the first and second slurries are delivered to the substrate surface;

distributing a slurry abrasiveness concentration between the slurry distribution screen and the slurry membrane that is greater at the center than at edge portions; and frictionally contacting the polishing pad to the substrate.

35. The method of claim 34 further comprising generating increased frictional contact at a predetermined area of the substrate by altering the composition of at least one of the first slurry and the second slurry.

* * * * *

UNITED STATES PATENT AND TRADEMARK OFFICE
CERTIFICATE OF CORRECTION

PATENT NO. : 6,514,863 B1
DATED : February 4, 2003
INVENTOR(S) : Gang He

It is certified that error appears in the above-identified patent and that said Letters Patent is hereby corrected as shown below:

Column 8,
Line 5, "28" should be -- 27 --;
Line 7, "29" should be -- 27 --;
Line 9, "30" should be -- 24 --;
Line 11, "adjusting" should be -- providing a --;
Line 14, "32" should be -- 31 --; and
Line 17, "33" should be -- 24 --.

Signed and Sealed this

Second Day of September, 2003

JAMES E. ROGAN
*Director of the United States Patent and Trademark Office*